US007195859B2

(12) United States Patent
Verschueren

(10) Patent No.: US 7,195,859 B2
(45) **Date of Patent: *Mar. 27, 2007**

(54) METHOD OF MAKING A LITHOGRAPHIC PRINTING PLATE PRECURSOR

(75) Inventor: Eric Verschueren, Merksplas (BE)

(73) Assignee: AGFA-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 10/530,130

(22) PCT Filed: Sep. 12, 2003

(86) PCT No.: PCT/EP03/50622

§ 371 (c)(1), (2), (4) Date: Apr. 4, 2005

(87) PCT Pub. No.: WO2004/030924

PCT Pub. Date: Apr. 15, 2004

(65) Prior Publication Data

US 2005/0287477 A1 Dec. 29, 2005

Related U.S. Application Data

(60) Provisional application No. 60/420,135, filed on Oct. 22, 2002.

(30) Foreign Application Priority Data

Oct. 4, 2002 (EP) .................................. 02102414

(51) Int. Cl.
*G03F 7/12* (2006.01)

(52) U.S. Cl. ...................... 430/302; 430/348; 430/494; 101/463.1

(58) Field of Classification Search ............. 430/270.1, 430/302, 348, 494; 101/463.1
See application file for complete search history.

(56) References Cited

U.S. PATENT DOCUMENTS 3,468,725 A 9/1969 Uhlig (Continued)

FOREIGN PATENT DOCUMENTS

DE 1447963 11/1968

(Continued)

OTHER PUBLICATIONS

National Phase of PCT/EP2003/050621, Preliminary Amendment, Apr. 4, 2005.

(Continued)

*Primary Examiner*—Barbara L. Gilliam
(74) *Attorney, Agent, or Firm*—Leydig, Voit & Mayer, Ltd.

(57) ABSTRACT

A method of making a heat-sensitive lithographic printing plate precursor is disclosed which comprises the steps of (i) providing a web of a lithographic support having a hydrophilic surface; (ii) applying on the hydrophilic surface of the web a coating comprising a phenolic resin; (iii) drying the coating by supplying heat to the coated web; (iv) a cooling step wherein the web temperature is reduced at an average cooling rate which is higher than if the web would be kept under ambient conditions but not higher than 30° C./s; and (v) winding the precursor on a core or cutting the precursor into sheets. The cooling step provides a significant improvement of the aging behavior of the precursor. A stable sensitivity is obtained shortly after coating.

34 Claims, 1 Drawing Sheet

U.S. PATENT DOCUMENTS

| | | | | |
|---|---|---|---|---|
| 3,971,660 | A | 7/1976 | Staehle | |
| 4,045,232 | A | 8/1977 | Parkinson | |
| 4,284,705 | A | 8/1981 | Phlipot et al. | |
| 4,458,005 | A | 7/1984 | Mohr et al. | |
| 4,840,713 | A | 6/1989 | Pliefke | |
| 4,981,517 | A | 1/1991 | DeSanto, Jr. et al. | |
| 5,156,723 | A | 10/1992 | Pliefke et al. | |
| 5,163,368 | A | 11/1992 | Pensavecchia et al. | |
| 5,174,205 | A | 12/1992 | Kline et al. | |
| 5,219,700 | A | 6/1993 | Nakai et al. | |
| 5,556,531 | A | 9/1996 | Wiedemann | |
| 5,637,441 | A | 6/1997 | Brenk et al. | |
| 6,063,544 | A | 5/2000 | Sheriff et al. | |
| 6,140,392 | A | 10/2000 | Kingman et al. | |
| 6,190,825 | B1 | 2/2001 | Denzinger et al. | |
| 6,251,559 | B1 | 6/2001 | Huang et al. | |
| 6,255,042 | B1 | 7/2001 | Fiebag et al. | |
| 6,723,489 | B2 * | 4/2004 | Aburano et al. | 430/270.1 |
| 2002/0098288 | A1 * | 7/2002 | Kamitani | 427/374.1 |
| 2006/0000377 | A1 * | 1/2006 | Verschueren | 101/463.1 |

FOREIGN PATENT DOCUMENTS

| | | | |
|---|---|---|---|
| DE | 40 01 466 | A1 | 7/1991 |
| DE | 44 17 907 | A1 | 11/1995 |
| DE | 44 23 140 | A1 | 1/1996 |
| EP | 0 291 760 | | 11/1988 |
| EP | 0 292 801 | | 11/1988 |
| EP | 0 537 633 | A1 | 4/1993 |
| EP | 0 556 690 | A1 | 8/1993 |
| EP | 0 601 240 | A1 | 6/1994 |
| EP | 0 625 728 | A2 | 11/1994 |
| EP | 0 659 909 | A1 | 6/1995 |
| EP | 0 823 327 | A2 | 2/1998 |
| EP | 0 864 420 | A1 | 9/1998 |
| EP | 0 894 622 | A2 | 2/1999 |
| EP | 0 901 902 | A2 | 3/1999 |
| EP | 0 933 682 | A2 | 8/1999 |
| EP | 0 950 517 | A1 | 10/1999 |
| EP | 0 950 518 | A1 | 10/1999 |
| EP | 0 978 376 | A2 | 2/2000 |
| EP | 1 029 667 | A1 | 8/2000 |
| EP | 1 053 868 | A2 | 11/2000 |
| EP | 1 074 386 | A2 | 2/2001 |
| EP | 1 074 889 | A2 * | 2/2001 |
| EP | 1 093 934 | A1 | 4/2001 |
| FR | 2300354 | | 9/1976 |
| GB | 1084070 | | 9/1967 |
| GB | 1154749 | | 6/1969 |
| GB | 1419512 | | 12/1975 |
| JP | 20-96755 | | 4/1990 |
| JP | 60-88942 | | 3/1994 |
| WO | WO 97/39894 | A1 | 10/1997 |
| WO | WO 99/21715 | A1 | 5/1999 |
| WO | WO 99/63407 | A1 | 12/1999 |
| WO | WO 00/29214 | A1 | 5/2000 |
| WO | WO 00/32705 | A1 | 6/2000 |
| WO | WO 01/45958 | A2 | 6/2001 |
| WO | WO 04/030923 | A2 | 4/2004 |
| WO | WO 04/030925 | A1 | 4/2004 |

OTHER PUBLICATIONS

National Phase PCT/EP2003/050623, Preliminary Amendment, Apr. 4, 2005.

* cited by examiner

METHOD OF MAKING A LITHOGRAPHIC PRINTING PLATE PRECURSOR

FIELD OF THE INVENTION

The present invention relates to a heat-sensitive lithographic printing plate precursor that comprises a phenolic resin.

BACKGROUND OF THE INVENTION

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by crosslinking of a polymer, heat-induced solubilization, or particle coagulation of a thermoplastic polymer latex.

Although some of these thermal processes enable plate making without wet processing, the most popular thermal plates form an image by a heat-induced solubility difference in an alkaline developer between exposed and non-exposed areas of the coating. The coating typically comprises an oleophilic binder, e.g. a phenolic resin, of which the developer solubility is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in EP-As 625728, 823327, 825927, 864420, 894622 and 901902.

The industrial manufacturing of printing plate precursors involves the steps of unwinding a coil of the support material in web form which is typically aluminum, coating one or more layers on the web, drying the coating by blowing hot air on the web and finally rewinding the coated web on a core or immediately cutting the coated web in sheets which are then stacked and packaged. On an industrial scale, all these steps are carried out "on-line", i.e. on a moving web in a single continuous operation without any intermediate storage.

A specific problem associated with thermal plate precursors comprising phenolic resins is that their sensitivity is not stable over time because the coating gradually becomes more resistant against the developer and therefore more heat needs to be applied during the image-wise exposure for triggering the imaging mechanism. Typically a high sensitivity, e.g. less than 100 mJ/cm$^2$, is obtained just after coating and then slowly decreases to reach an equilibrium value of e.g. 250 mJ/cm$^2$. The aging period that is required to arrive at a stable sensitivity may take several months after coating. In order to reduce the aging period, WO 99/21715 proposes a heat treatment by leaving the material shortly after coating in an oven at 40 to 90° C. for an extended period, which is at least 4 hours and most preferably at least 48 hours. U.S. Pat. No. 6,251,559 disclosed that a controlled slow cooling after the heat treatment provides additional improvements. According to the latter document, "controlled slow cooling" means that heat is lost from the precursor more slowly than if it is cooled under ambient conditions. Examples of such a cooling method include insulating the material after the heat treatment or leaving it in an oven which progressively cools to lower temperature. Such a cooling process lasts several hours and can only be carried out "off-line", i.e. a coil or a stack of sheets is placed in an oven and left there during the required time. Off-line storage however is to be avoided for several reasons. Besides additional cost and logistic implications, it is quite clear that a coil or stack cannot be cooled uniformly since the interior of the coil or stack will go through a different temperature profile than the exterior. Therefore, there is a need for a method that provides an effective cooling step which can be implemented on-line, before winding the web on a coil or cutting the web into sheets.

SUMMARY OF THE INVENTION

It is an aspect of the present invention to provide an on-line method for aging heat-sensitive printing plate materials which contain a phenolic resin. This object is realized by the method of claim 1, having the characterizing feature that the dried coating is subjected to an on-line cooling step. According to the present invention, the long cooling processes which have been disclosed in the prior art and which can only be carried out off-line, are replaced by an on-line cooling step wherein the web temperature is reduced at an average cooling rate which is higher than if the web would be kept under ambient conditions but not higher than 30° C./s.

The method of the present invention allows to manufacture heat-sensitive printing plate precursors having a stable sensitivity within a couple of weeks instead of several months after manufacturing. No additional aging is required, but it is self evident that embodiments wherein an on-line cooling step according to the present invention is combined with an additional off-line cooling step, are nevertheless within the scope of the present invention.

Specific embodiments of the invention are defined in the dependent claims.

DETAILED DESCRIPTION OF THE INVENTION

Figure 1:
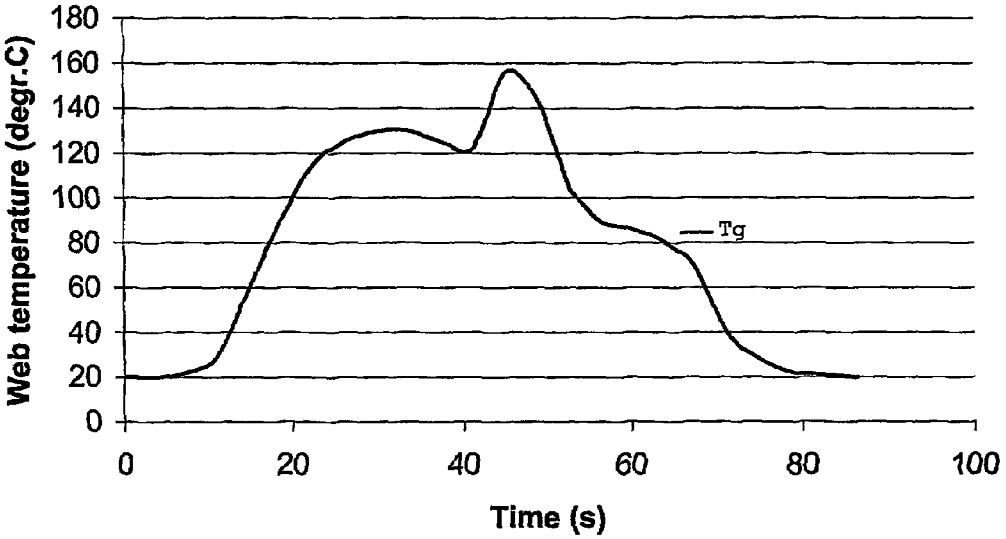
FIG. 1 shows the web temperature profile during a preferred method of making a heat-sensitive lithographic printing plate precursor according to the present invention.

The heat-sensitive lithographic printing plate precursor of the present invention contains a hydrophilic support and a coating comprising a phenolic resin provided thereon. The coating may consist of one or more layer(s) of which examples are discussed below. The phenolic resin can be present in one or more layers of said coating.

Any reference herein to the temperature of the precursor is considered as a reference to the temperature of the support as well as of the coating: typically, the coating is very thin, in the order of magnitude of one or a few micrometer, whereas the support has a typical thickness of between 0.1 and 0.5 millimeter; therefore the support, which is preferably a metal support, acts as a large heat sink towards the coating and the temperature of the coating is equal to or very close to the temperature of the support, irrespective whether the heating and cooling steps discussed herein are carried out by supplying heat or cold to the coated side or the back side of the precursor, or both. In practice, temperature values reported herein have been recorded by attaching a thermocouple device, which can be read out remotely, to the back side of the web as it moves through all the sections of the coating facility. In that way, a precise temperature profile can be recorded during all steps of the method of the present invention. Unless specifically defined otherwise, all temperatures reported herein are web temperatures obtained from said thermocouple. In view of the above considerations, it is clear to the skilled person that the web temperature value is essentially equal to the temperature of the dry coating that is provided on the web.

Any coating method can be used for applying one or more coating solutions to the hydrophilic surface of the support. A multi-layer coating can be applied by coating/drying each layer consecutively or by the simultaneous coating of several coating solutions at once. Drying is typically carried out by blowing hot air onto the coating, typically at a temperature of at least 70° C., suitably 80–150° C. and especially 90–140° C. Also other heat sources, e.g. infrared lamps or microwave radiation, can be used in the drying step. The drying time may typically be 15–600 seconds. However it is not necessary (and may not even be possible) to remove all the solvent in the drying step. Indeed the residual solvent content may be regarded as an additional composition variable by means of which the coating composition may be optimized. The end of the drying step is therefore defined herein as the moment at which the coating becomes self-supporting and dry to the touch.

After the end of the drying step, the precursor is preferably subjected to a short on-line additional heating step. Alternatively, the precursor may first be allowed to cool between the drying and the heating step but this is not required. During the optional heating step, heat is supplied to the dry coating so that the temperature of the coating is maintained at a higher value than if the precursor would be kept under ambient conditions (the temperature of the ambient air is set herein by definition at 20° C.). So the temperature of the precursor during the heating step can be lower than at the end of the drying step. More preferred, the temperature of the coating during the heating step is maintained at a value which is higher than the temperature of the coating at the end of the drying step. Alternatively, the dried coating can be heat-treated by extending the length of the drier so that additional drying air is blown onto the coating after it has become dry. In that embodiment, the temperature of the coating during the heat treatment may be the same as the temperature at the end of the drying step.

During the on-line heating step, the web temperature of the precursor is preferably increased above the glass transition temperature Tg of the phenolic resin. "Tg" referred to herein is the glass transition temperature of the phenolic resin in the composition as it has been coated, dried and heated, i.e. the glass transition temperature of the coating comprising the phenolic resin. Said Tg value can readily be measured by the known calorimetric methods. The heat treatment is sufficiently short so that it can be implemented on-line, e.g. between 0.1 and 60 seconds, more preferably from 1 to 30 seconds. Preferably, the web temperature is increased during the heating step up to at least 150° C., preferably at least 170° C. The upper web temperature limit during the heating step is defined by the temperature threshold that is required to trigger the imaging mechanism of the coating. Said upper limit is therefore dependent on the particular composition of the coating, but is typically about 200° C. or more preferably about 250° C. Heating at still higher temperature may induce irreversible chemical or physical changes in the coating which would render the precursor unsuitable for image recording.

Heating can be carried out e.g. by blowing hot air and/or steam onto the lithographic printing plate precursor, by irradiating the precursor with infrared light or microwaves, or by contacting the precursor with a heated roller. Combinations of these methods are also suitable. The hot air and/or steam preferably has a temperature of more than 150° C., more preferably at least 170° C. The infrared light may irradiate the coating, the back side of the support or both. If the infrared light irradiates the coating, then it has a wavelength and/or intensity which does not trigger the imaging mechanism of the coating. The heated roller, which is preferably thermostatically controlled, may likewise be contacted against the coating, the back side of the support or both, the back side being preferred. The roller is preferably a metal roller.

After the heating step, the precursor is cooled before being wound on a core or cut in individual sheets. The cooling step is a fast, "active" cooling step, i.e. it reduces the temperature of the coating at a higher cooling rate than if the precursor would be kept under ambient conditions. So the cooling step, referred to herein, is defined as the step between the start and the end of the active cooling. In preferred embodiments, further discussed below, the cooling step is a multi-phase process wherein the active cooling can be interrupted by a "passive" cooling phase, typically in the transition of the temperature interval around Tg. By "passive" cooling is meant a cooling step during which the web is cooled at an average cooling rate which is lower than or equal to the cooling rate obtained if the precursor would be kept under ambient conditions. So the cooling step in the method of the present invention can be a sequence of one or more active and passive cooling phases. In such multi-phase cooling processes, the active cooling step is defined as the process between the beginning of the first active cooling phase and the end of the last active cooling phase.

The average cooling rate during the cooling step or during a cooling phase is defined as the ratio of the temperature difference between the beginning and end of the cooling step or phase and the duration of said cooling step or phase.

Active cooling can be obtained by various means, e.g. by contacting the precursor against one or more roller(s), preferably metal roller(s) so that the heat of the precursor is readily transferred to the roller(s). Other cooling methods are of course also possible, e.g. by blowing air onto the precursor. The use of a metal cooling roller is however preferred because, due to the intimate contact between the cooling roller and the precursor, a temperature decrease which is faster than if the precursor would be kept in ambient conditions, i.e. without contact with a cooling roller, can be induced even if the temperature of the cooling roller is maintained at a value which is higher than the temperature of the ambient air. So active cooling can be obtained by contacting the precursor, just after the heating step, against a metal cooling roller which has a temperature of e.g. 50 to 120° C. Cooling rollers consisting of other materials, e.g. with a lower heat-capacity or heat-conductivity can also be used. The cooling roller can be contacted against the back side or the coated side of the web, or both. It is quite clear that a faster cooling effect is obtained if the temperature difference between the cooling roller and the precursor is higher. A preferred minimum value of the average cooling rate is 0.5° C./s, more preferably 1° C./s and even more preferably 3° C./s.

It is been established by the inventors that an improved aging behavior can be obtained by limiting the average cooling rate to a value of not more than 30° C./s, more preferably not more than 20° C./s and most preferably not more than 10° C./s. The reason therefore probably is related to the high content of amorphous state if the phenolic resin is rapidly cooled below its Tg. If the coating comprises a high amount of phenolic resin in the amorphous state, the relaxation to a more crystalline state which inevitably occurs in the days or weeks after the coating then could explain the shift towards lower sensitivity that can be observed during the aging of the material.

On the other hand, a shorter, faster cooling step is preferred in view of the high speed at which the web is traveling through modern coating facilities because otherwise the duration of the cooling step would extend the length of the coating alley too much. The best compromise between these apparently contradictory requirements can be obtained by a three-phase cooling step as follows:

- cooling phase 1: rapid cooling to decrease the temperature of the precursor down to a value T1, which is higher than Tg of the phenolic resin.
- cooling phase 2: slower cooling to decrease the temperature of the precursor to a value T2 below Tg.
- cooling phase 3: again rapid cooling down to about ambient temperature.

The first rapid cooling phases may involve a very high average cooling rate, e.g. at least 10° C./s, more preferably 10 to 20° C./s or even more than 20° C./s. In the second cooling phase, the transition of the temperature interval around Tg is made at a low average cooling rate, i.e. the web temperature of the precursor is reduced in the interval T1 to T2 at an average cooling rate which is lower than in phase 1, e.g. lower than 10° C./s. Preferred values of T1 and T2 are Tg+20° C. and Tg−20° C. respectively, more preferably Tg+10° C. and Tg−10° C. respectively. According to an even more preferred embodiment, the rapid cooling in phase 1 progresses until the temperature of the precursor is just above Tg of the phenolic resin, then a slow cooling is set in from just above Tg to just below Tg and then, finally, another rapid cooling phase can be applied without inducing a significant impact on the aging behavior. The range between "just above" and "just below" Tg as used herein is e.g. the range from Tg+5° C. to Tg−5° C., more preferably from Tg+2° C. to Tg−2° C.

The average cooling rate in the second cooling phase may be higher or lower than the cooling rate corresponding to ambient conditions, i.e. without the use of cooling means such as a roller. A preferred average cooling rate in the second cooling phase ranges from 0.1° C./s to 5° C./s, more preferably 0.2° C./s to 3° C./s; values between 1° C./s and 2° C./s produce excellent results. Once the web temperature has been decreased until below Tg in that way, again a rapid cooling can be applied in the third cooling phase, e.g. at an average cooling rate of at least 10° C./s, more preferably 10 to 20° C./s or even more than 20° C./s.

Phenolic resins such as the commercially available novolacs have a typical Tg between 75 and 95° C., more typically between 80 and 90° C. A typical example of a preferred web temperature profile according to the invention is shown in FIG. 1, wherein the Tg of the phenolic resin is 84° C. In FIG. 1, the drying was carried out with hot air having a temperature of 130° C. and hot air at 160° C. was used for the heating step. During the first cooling phase, a rapid cooling was obtained from >150° C. down to 100° C. in a few seconds, followed by a slower cooling from 100° to 70° C. in a period of 16 seconds (i.e. at an average cooling rate of 1.9° C./s) and finally again a rapid cooling phase to reach about ambient temperature in a few seconds.

The above described heating and cooling steps provide a material which is characterized by a stable sensitivity after an aging period which is significantly shorter than if the material has not been subjected to these steps, e.g. a couple of weeks compared to several months. In addition to the improved aging behavior, the coating of materials according to the invention also show a significant improvement of the resistance towards mechanical damage. More particularly, the rub resistance is highly enhanced by the above described cooling process wherein the interval around Tg is passed slowly.

Figure 2:
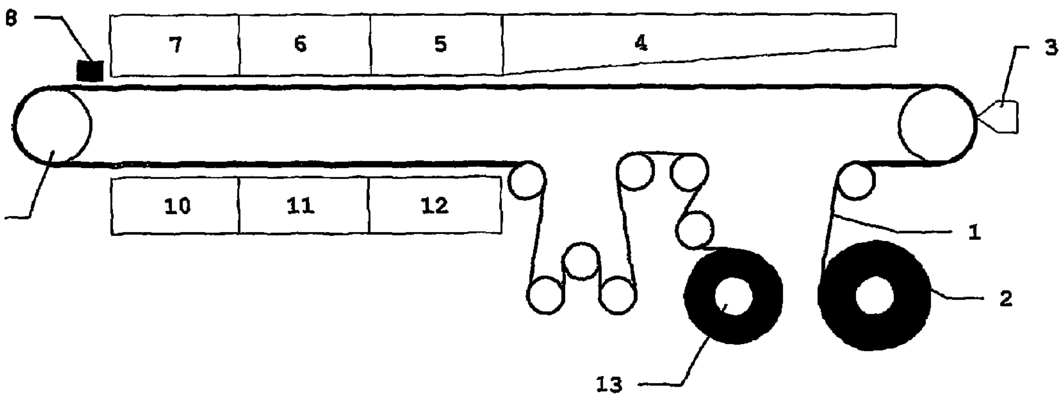
FIG. 2 shows a schematic representation of an apparatus for performing a suitable example of the method of the present invention.

The methods of the present invention can be carried out in a coating facility of which a typical example is shown in FIG. 2. The support 1 is unwound from a coil 2, then applied with one or more layers with coater 3, the coating is subsequently dried in a multi-section drier 4-5-6-7, heat-treated by heat source 8, which is e.g. an infrared light source or a nozzle blowing hot air, then cooled by roller 9 and finally wound up on core 13. Air nozzles 10-11-12 can be used for additional cooling: roller 9 is preferably maintained at a temperature just above Tg of the phenolic resin and nozzle 10 just below Tg so that the transition of the temperature interval around Tg is slow.

The formation of the lithographic image by the plate precursor of the present invention is due to a heat-induced solubility differential of one or more layers of the coating during processing in the developer. Typically, the developer solubility of the layer comprising the phenolic resin is changed by the exposure. One or more additional layer(s) may contribute to the imaging process. In some embodiments, the coating may further comprise layer(s) which do not contribute to the imaging mechanism, e.g. a layer of which the solubility in the developer does not substantially change upon exposure. An example thereof is a protective layer which is provided at the top of the coating and which may dissolve in the developer at both exposed and non-exposed areas. Also layers which are provided between the support and the image-forming layers are typically not contributing to the imaging process.

The solubility differentiation between image (printing, oleophilic) and non-image (non-printing, hydrophilic) areas of the lithographic image is characterized by a kinetic rather than a thermodynamic effect, i.e. the non-image areas are characterized by a faster dissolution in the developer than the image-areas. In a most preferred embodiment, the non-image areas dissolve completely in the developer before the image areas are attacked so that the latter are characterized by sharp edges and high ink-acceptance. The time difference between completion of the dissolution of the non-image areas and the onset of the dissolution of the image areas is preferably longer than 10 seconds, more preferably longer than 20 seconds and most preferably longer than 60 seconds, thereby offering a wide development latitude.

According to one embodiment, the printing plate precursor is negative-working, i.e. the image areas correspond to the exposed areas. A suitable negative-working coating comprises a phenolic resin and a latent Brönsted acid which produces acid upon heating or IR radiation. These acids catalyze crosslinking of the coating in a post-exposure heating step and thus hardening of the exposed regions. Accordingly, the non-exposed regions can be washed away by a developer to reveal the hydrophilic substrate underneath. For a more detailed description of such a negative-working printing plate precursor we refer to U.S. Pat. No. 6,255,042 and U.S. Pat. No. 6,063,544 and to references cited in these documents.

According to another embodiment, the printing plate precursor is positive-working. In such an embodiment, one or more layers of the coating are capable of heat-induced solubilization, i.e. they are resistant to the developer and ink-accepting in the non-exposed state and become soluble in the developer upon exposure to heat or infrared light to such an extent that the hydrophilic surface of the support is revealed thereby. So after exposure and development, the exposed areas are removed from the support and define hydrophilic, non-image (non-printing) areas, whereas the unexposed areas are not removed from the support and define an oleophilic image (printing) area.

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent. The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

The phenolic resin is preferably a binder having acidic groups with a pKa of less than 13 to ensure that it is soluble or at least swellable in aqueous alkaline developers. Advantageously, the binder is a polymer or polycondensate having free phenolic hydroxyl groups, as obtained, for example, by reacting phenol, resorcinol, a cresol, a xylenol or a trimethylphenol with aldehydes, especially formaldehyde, or ketones. The polymers may additionally contain units of other monomers which have no acidic units. Such units include vinylaromatics, methyl (meth)acrylate, phenyl (meth)acrylate, benzyl (meth)acrylate, methacrylamide or acrylonitrile. In a preferred embodiment, the phenolic resin is a novolac, a resole or a polyvinylphenol. The novolac is preferably a cresol/formaldehyde or a cresol/xylenol/formaldehyde novolac, the amount of novolac advantageously being at least 50% by weight, preferably at least 80% by weight, based in each case on the total weight of all binders. The amount of the phenolic resin is advantageously from 40 to 99.8% by weight, preferably from 70 to 99.4% by weight, particularly preferably from 80 to 99% by weight, based in each case on the total weight of the nonvolatile components of the coating.

The dissolution behavior of the phenolic resin in the developer can be fine-tuned by optional solubility regulating components. More particularly, development accelerators and development inhibitors can be used. These ingredients can be added to the layer which comprises the phenolic resin and/or to (an)other layer(s) of the coating.

Development accelerators are compounds which act as dissolution promoters because they are capable of increasing the dissolution rate of the phenolic resin. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydro-phthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight.

In a preferred embodiment, the coating also contains developer resistance means, also called development inhibitors, i.e. one or more ingredients which are capable of delaying the dissolution of the unexposed areas during processing. The dissolution inhibiting effect is preferably reduced by heating, so that the dissolution of the exposed areas is not delayed and a large dissolution differential between exposed and unexposed areas can thereby be obtained. Such developer resistance means can be added to a layer which comprises the phenolic resin or to another layer of the material.

The compounds described in e.g. EP-A 823 327 and WO97/39894 act as dissolution inhibitors due to interaction, e.g. by hydrogen bridge formation, with the alkali-soluble binder(s) in the coating. Inhibitors of this type typically comprise a hydrogen bridge forming group such as nitrogen atoms, onium groups, carbonyl (—CO—), sulfinyl (—SO—) or sulfonyl (—$SO_2$—) groups and a large hydrophobic moiety such as one or more aromatic nuclei.

Other suitable inhibitors improve the developer resistance because they delay the penetration of the aqueous alkaline developer into the layer comprising the phenolic resin. Such compounds can be present in the layer itself, as described in e.g. EP-A 950 518, or in a development barrier layer on top of said layer, as described in e.g. EP-A 864 420, EP-A 950 517, WO 99/21725 and WO 01/45958. In the positive working embodiment, the barrier layer preferably comprises a polymeric material which is insoluble in or impenetrable by the developer, e.g. acrylic (co-)polymers, polystyrene, styrene-acrylic copolymers, polyesters, polyamides, polyureas, polyurethanes, nitrocellulosics, epoxy resins and silicones. In this embodiment, the solubility of the barrier layer in the developer or the penetrability of the barrier layer by the developer can be increased by exposure to heat or infrared light.

Preferred examples of inhibitors of the latter type include water-repellent polymers such as a polymer comprising siloxane and/or perfluoroalkyl units. In a typical embodiment, the precursor comprises a barrier layer which contains such a water-repellent polymer in a suitable amount between 0.5 and 25 mg/$m^2$, preferably between 0.5 and 15 mg/$m^2$ and most preferably between 0.5 and 10 mg/$m^2$. Higher or lower amounts are also suitable, depending on the hydrophobic/oleophobic character of the compound. When the water-repellent polymer is also ink-repelling, e.g. in the case of polysiloxanes, higher amounts than 25 mg/$m^2$ can result in poor ink-acceptance of the non-exposed areas. An amount lower than 0.5 mg/$m^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellant polymer is a block-copolymer or a graft-copolymer of a poly(alkylene oxide) and a polymer comprising siloxane and/or perfluoroalkyl units. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, tends to position itself at the interface between the coating and air and thereby forms a separate top layer even when applied as an ingredient of the same solution as the phenolic resin.

Simultaneously, such surfactants act as a spreading agent which improves the coating quality. Alternatively, the water-repellent polymer can be applied in a second solution, coated on top of the layer which comprises the phenolic resin. In that embodiment, it may be advantageous to use a solvent in the second coating solution that is not capable of dissolving the ingredients present in the first layer so that a highly concentrated water-repellent phase is obtained at the top of the material.

The coating preferably also contains a compound which absorbs infrared light and converts the absorbed energy into heat. The IR absorbing compound may be present in the same layer as the phenolic resin, in the optional barrier layer discussed above or in an optional other layer. According to a highly preferred embodiment, the dye or pigment is concentrated in or near the barrier layer, e.g. in an intermediate layer between the oleophilic and the barrier layer. According to that embodiment, said intermediate layer comprises the IR absorbing compound in an amount higher than the amount of IR absorbing compound in the oleophilic or in the barrier layer. The concentration of the IR absorbing compound in the coating is typically between 0.25 and 10.0 wt. %, more preferably between 0.5 and 7.5 wt. %. Preferred IR absorbing compounds are dyes such as cyanine and merocyanine dyes or pigments such as carbon black. Examples of suitable IR absorbers are described in e.g. EP-As 823327, 978376, 1029667, 1053868, 1093934, WO 97/39894 and 00/29214. A preferred compound is the following cyanine dye:

IR-1

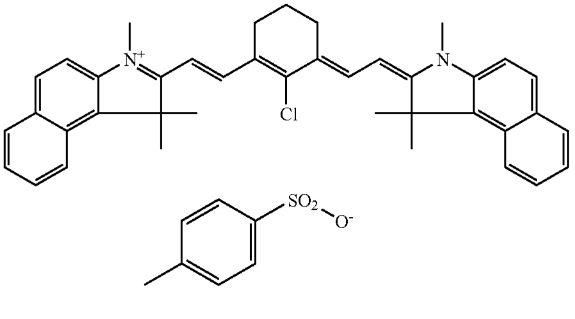

On order to protect the surface of the coating, in particular from mechanical damage, a protective layer may also optionally be applied. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.1 to 3.0 μm, particularly preferably from 0.15 to 1.0 μm.

Optionally, the coating and more specifically the one or more layer(s) which comprise the phenolic resin, may further contain additional ingredients. Preferred ingredients are e.g. additional binders, especially sulfonamide and phthalimide groups containing polymers, to improve the run length and chemical resistance of the plate. Examples of such polymers are those described in EP-A 933682, EP-A 894622 and WO 99/63407. Also colorants can be added such as dyes or pigments which provide a visible color to the coating and which remain in the coating at unexposed areas so that a visible image is produced after exposure and processing. Typical examples of such contrast dyes are the amino-substituted tri- or diarylmethane dyes, e.g. crystal violet, methyl violet, victoria pure blue, flexoblau 630, basonlblau 640, auramine and malachite green.

For the preparation of the lithographic plate precursor, any known method can be used. For example, the above ingredients can be dissolved in a solvent mixture which does not react irreversibly with the ingredients and which is preferably tailored to the intended coating method, the layer thickness, the composition of the layer and the drying conditions. Suitable solvents include ketones, such as methyl ethyl ketone (butanone), as well as chlorinated hydrocarbons, such as trichloroethylene or 1,1,1-trichloroethane, alcohols, such as methanol, ethanol or propanol, ethers, such as tetrahydrofuran, glycol-monoalkyl ethers, such as ethylene glycol monoalkyl ether, e.g. 2-methoxy-1-propanol, or propylene glycol monoalkyl ether and esters, such as butyl acetate or propylene glycol monoalkyl ether acetate. It is also possible to use a mixture which, for special purposes, may additionally contain solvents such as acetonitrile, dioxane, dimethylacetamide, dimethylsulfoxide or water.

The end-user can image-wise expose the lithographic printing plate precursor directly with heat, e.g. by means of a thermal head, or indirectly by infrared light, preferably near infrared light. The infrared light is preferably converted into heat by an IR light absorbing compound as discussed above. The heat-sensitive lithographic printing plate precursor of the present invention is preferably not sensitive to visible light, i.e. no substantial effect on the dissolution rate of the coating in the developer is induced by exposure to visible light. Most preferably, the coating is not sensitive to ambient daylight, i.e. visible (400–750 nm) and near UV light (300–400 nm) at an intensity and exposure time corresponding to normal working conditions so that the material can be handled without the need for a safe light environment. "Not sensitive" to daylight shall mean that no substantial change of the dissolution rate of the coating in the developer is induced by exposure to ambient daylight. In a preferred daylight stable embodiment, the coating does not comprise photosensitive ingredients, such as (quinone)diazide or diazo(nium) compounds, photoacids, photoinitiators, sensitizers etc., which absorb the near UV and/or visible light that is present in sun light or office lighting and thereby change the solubility of the coating in exposed areas.

The printing plate precursor of the present invention can be exposed to infrared light by means of e.g. LEDs or a laser. Most preferably, the light used for the exposure is a laser emitting near infrared light having a wavelength in the range from about 750 to about 1500 nm, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10–25 μm), the scan speed and the resolution of the exposure apparatus (i.e. the number of addressable pixels per unit of linear distance, often expressed in dots per inch or dpi; typical value: 1000–4000 dpi).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the non-image areas of the coating are removed by immersion in a conventional aqueous alkaline developer, which may be combined with mechanical rubbing, e.g. by a rotating brush. During development, any water-soluble protective layer present is also removed. Silicate-based developers which have a ratio of silicon dioxide to alkali metal oxide of at least 1 are preferred to ensure that the alumina layer (if present) of the substrate is not damaged. Preferred alkali metal oxides include $Na_2O$ and $K_2O$, and mixtures thereof. In addition to alkali metal silicates, the developer may optionally contain further components, such as buffer substances, complexing agents, antifoams, organic solvents in small amounts, corrosion inhibitors, dyes, surfactants and/or hydrotropic agents as well known in the art. The development is preferably carried out at temperatures of from 20 to 40° C. in automated processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of recording material. The addition can be regulated, for example, by measuring the conductivity as described in EP-A 0 556 690.

The plate precursor according to the invention can, if required, then be post-treated with a suitable correcting agent or preservative as known in the art. To increase the resistance of the finished printing plate and hence to extend the print run, the layer can be briefly heated to elevated temperatures ("baking"). As a result, the resistance of the printing plate to washout agents, correction agents and UV-curable printing inks also increases. Such a thermal post-treatment is described, inter alia, in DE-A 14 47 963 and GB-A 1 154 749.

Besides the mentioned post-treatment, the processing of the plate precursor may also comprise a rinsing step, a drying step and/or a gumming step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid inks which are suitable for use in the method of the present invention have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

The following composition was coated on a web of a conventional grained and anodized aluminum support at a wet coating thickness of 26 μm and a speed of 16 m/min:

| | |
|---|---|
| methoxypropanol (Dowanol PM ™) | 410.80 g |
| methyl ethyl ketone | 266.03 g |
| tetrahydrofuran | 209.20 g |
| 40.4 wt. % solution (Alnovol SPN 452 ™) of novolac in Dowanol PM ™ | 103.25 g |
| 3,4,5-trimethoxy cinnamic acid | 5.34 g |
| dye IR-1 (formula shown above) | 2.10 g |
| Basonylblau 640 ™ (contrast dye) | 0.53 g |
| TEGO Glide 265 ™ (10 wt. % solution of a polyalkyleneoxide/polysiloxane surfactant) | 0.85 g |
| TEGO Glide 410 ™ (10 wt. % solution of a polyalkyleneoxide/polysiloxane surfactant) | 2.12 g |

The coating was dried with air having a temperature of 135° C. and then subjected to an optional heating and a cooling step. During the heating step, air having the temperature indicated in Table 1 was blown onto the coating during 1.2 s. In Examples 1 and 2, the hot air nozzles were switched off. Immediately thereafter, the back side of the web was contacted with a metal cooling roller having the temperature indicated in Table 1. With a cooling roller at 57° C., the temperature of the heated coating is reduced to a value below Tg very rapidly (>30° C./s). With a cooling roller at 75° C., the temperature interval around Tg is passed at a much lower average cooling rate.

The materials were then imaged on a Creo Trendsetter 3244 (830 nm) at various energy density settings. The exposed plates were processed in an Agfa Autolith PN85 processor operating at a speed of 0.84 m/min using Agfa Ozasol EP26 developer at 25° C. and finally gummed with Agfa Ozasol RC795. The IR-sensitivity was defined as the minimum energy density that is required to obtain a 50% light absorption, measured on the developed plate at the wavelength maximum of the dye, in areas which have been exposed with a dot area of a 50% screen (@200 lpi). The sensitivity was determined on fresh material and on material aged at ambient conditions during the number of days as indicated in Table 1.

TABLE 1

| Example | heating air temp. (° C.) | cooling roller temp. (° C.) | sensitivity(mJ/$cm^2$) after aging 0 d. | 5 d. | 10 d. | 15 d. | 25 d. |
|---|---|---|---|---|---|---|---|
| 1 (comp.) | — | 57 | — | 26 | 60 | 80 | 107 |
| 2 (inv.) | — | 75 | — | 103 | 110 | 133 | 130 |
| 3 (inv.) | 170 | 75 | 93 | 160 | 187 | 208 | 205 |

The data in Table 1 demonstrate that the materials which were cooled according to the invention, reach a stable sensitivity from 15 days after coating, whereas the sensitivity of the comparative material in Example 1 was still shifting after 25 days and was found to level off at 165 mJ/$cm^2$ about two months after coating.

The improved aging behavior can also be demonstrated by subjecting the materials to an off-line heat treatment after applying the method of the present invention. Examples 4, 5 and 6 were obtained by coating the same composition and drying according to the same procedure as discussed for the previous examples. The dried materials were then subjected to a heat treatment by using an additional drier which blew air at 135° C. onto the dry coating. Between the latter heat treatment and the cooling roller, the web cooled under ambient conditions so that the web temperature was 118° C. just before the cooling roller. A first rapid cooling was obtained with a metal roller of which the temperature was maintained at the value given in Table 2. The contact between the material and the cooling roller lasted 2.41 s. Immediately after passing the metal cooling roller, a second slower cooling phase was passed by blowing air at 50° C. onto the coating during 32 s.

TABLE 2

| | Cooling at metal roller (2.41 s) | | | Cooling with air @50° C. (32 s) | |
|---|---|---|---|---|---|
| Example | cooling roller temp. (° C.) | web temp. just after cooling roller (° C.) | average cooling rate at cooling roller (° C./s) | web temp. just after cooling air (° C.) | average cooling rate in cooling air (° C./s) |
| 4 | 65 | 66 | 22 | 51 | 0.47 |
| 5 | 75 | 76 | 18 | 57 | 0.59 |
| 6 | 85 | 86 | 14 | 63 | 0.72 |

The sensitivity was measured on fresh material and on material that was artificially aged off-line during 7 days at the temperature given in Table 3. The data in Table 3 demonstrate that the materials which are cooled more slowly, i.e. with a higher cooling roller temperature, have a more stable aging behavior. Example 6 was cooled in the interval near Tg at a very slow cooling rate and provides the best aging behavior, since there is little effect from the additional off-line heat treatment.

TABLE 3

| Example | 0 d. | 7 d. @20° C. | 7 d. @25° C. | 7 d. @30° C. |
|---|---|---|---|---|
| 4 | 17 | 159 | 210 | 222 |
| 5 | 87 | 167 | 200 | 226 |
| 6 | 101 | 210 | 220 | 233 |

The invention claimed is:

1. A method of making a heat-sensitive lithographic printing plate precursor comprising the steps of (i) providing a web of a lithographic support having a hydrophilic surface;

(ii) applying a coating comprising a phenolic resin on the hydrophilic surface of the web;

(iii) drying the coating by supplying heat to the coated web;

(iv) an active cooling step wherein the web temperature is reduced at an average cooling rate which is higher than if the web would be kept under ambient conditions and varies between 0.5 and 30° C./s; and (v) winding the precursor on a core or cutting the precursor into sheets.

2. The meted according to claim 1 wherein the average cooling rate is not higher than 20° C./s.

3. The method according to claim 2 further comprising a heating step between step (iii) and step (iv), wherein during said heating step the web temperature is maintained above the glass transition temperature of the phenolic resin during a period of between 0.1 and 60 seconds.

4. The method according to claim 3 wherein during the cooling step the web temperature is reduced in a first phase down to T1 at an average cooling rate of at least 10° C./s; and in a second phase from T1 to T2 at an average cooling rate which is lower than 10° C./s.

5. The method according to claim 3 wherein dining the cooling step the web temperature is reduced in a first phase dawn to T1 at an average cooling rate of at least 10° C./s; and in a second phase from T1 to T2 at an average cooling rate which is lower than 10° C./s; and in a third phase from T2 to about ambient temperature at an average cooling rate of at least 10° C./s.

6. The method according to claim 1 wherein the average cooling rate is not higher than 10°C./s.

7. The method according to claim 6 further comprising a heating step between step (iii) and step (iv), wherein during said heating step the web temperature is maintained above the glass transition temperature of the phenolic resin during a period of between 0.1 and 60 seconds.

8. The method according to claim 7 wherein during the cooling step the web temperature is reduced in a first phase down to T1 at an average cooling rate of at least 10° C./s; and in a second phase from T1 to T2 at an avenge cooling rate which is lower than 10° C./s.

9. The method according to claim 7 wherein during the cooling step the web temperature is reduced in a first phase down to T1 at an avenge cooling rate of at least 10° C./s; and in a second phase from T1 to T2 at an average cooling rate which is lower than 10° C./s; and in a third phase from T2 to about ambient temperature at an average cooling rate of at least 10° C./s.

10. The method according to claim 1 wherein at the beginning of the cooling step the web temperature is higher than Tg, the glass transition temperature of the coating comprising the phenolic resin, and wherein during the cooling step the web temperature is reduced from T1 to T2, T1 being higher than Tg and T2 being lower than Tg, at an average cooling rate which is lower than 10° C./s.

11. The method according to claim 10 wherein during the cooling step the web temperature is reduced in a first phase down to T1 at an average cooling rate of at least 10° C./s; and in a second phase from T1 to T2 at an average cooling rate which is lower than 10° C./s.

12. The method according to claim 11 wherein the cooling from T1 to T2 proceeds at an average cooling rate which is lower than 5° C./s.

13. The method according to claim 12 further comprising a heating step between step (iii) and step (iv), wherein dining said heating step the web temperature is maintained above the glass transition temperature of the phenolic resin during a period of between 0.1 and 60 seconds.

14. The method according to claim 11 wherein T1 is Tg+20° C. and T2 is Tg−20° C.

15. The method according to claim 14 further comprising a heating step between step (iii) and step (iv), wherein during said heating step the web temperature is maintained above the glass transition temperature of the phenolic resin during a period of between 0.1 and 60 seconds.

16. The method according to claim 11 wherein T1 is Tg+10° C. and T2 is Tg−10° C.

17. The method according to claim 16 further comprising a heating step between step (iii) and step (iv), wherein during said heating step the web temperature is maintained above the glass transition temperature of the phenolic resin during a period of between 0.1 and 60 seconds.

18. The method according to claim 11 further comprising a heating step between step (iii) and step (iv), wherein during said heating step the web temperature is maintained above the glass transition temperature of the phenolic resin during a period of between 0.1 and 60 seconds.

19. The method according to claim 10 wherein during the cooling step the web temperature is reduced in first phase down to T1 at an average cooling rate of at least 10° C./s; and in a second phase from T1 to T2 at an average cooling rate which is lower than 10° C./s; and in a third phase from T2 to about ambient temperature at an average cooling rate of at least 10° C./s.

20. The method according to claim 19 wherein the cooling from T1 to T2 proceeds at an avenge cooling rate which is lower than 5° C./s.

21. The method according to claim 20 further comprising a heating step between step (iii) and step (iv), wherein during said heating step the web temperature is maintained above the glass transition temperature of the phenolic resin during a period of between 0.1 and 60 seconds.

22. The method according to claim 19 wherein T1 is Tg+20° C. and T2 is Tg−20° C.

23. The method according to claim 19 wherein T1 is Tg+10° C. and T2 is Tg−10° C.

24. The method according to claim 19 further comprising a heating step between step (iii) and step (iv), wherein during said heating step the web temperature is maintained above the glass transition temperature of the phenolic resin during a period of between 0.1 and 60 seconds.

25. The method according to claim 10 wherein the cooling from T1 to T2 proceeds at an average cooling rate which is lower than 5° C./s.

26. The method according to claim 25 wherein T1 is Tg+20° C. and T2 is Tg−20° C.

27. The method according to claim 25 wherein T1 is Tg+10° C. and T2 is Tg−10° C.

28. The method according to claim 25 further comprising a heating step between step (iii) and step (iv), wherein during said heating step the web temperature is maintained above the glass transition temperature of the phenolic resin during a period of between 0.1 and 60 seconds.

29. The method according to claim 10 wherein T1 is Tg+20° C. and T2 is Tg−20° C.

30. The method according to claim 29 further comprising a heating step between step (iii) and step (iv), wherein during said heating step the web temperature is maintained above the glass transition temperature of the phenolic resin during a period of between 0.1 and 60 seconds.

31. The method according to claim 10 wherein T1 is Tg+10° C. and T2 is Tg−10° C.

32. The method according to claim 31 further comprising a heating step between step (iii) and step (iv), wherein during said heating step the web temperature is maintained above the glass transition temperature of the phenolic resin during a period of between 0.1 and 60 seconds.

33. The method according to claim 10 further comprising a heating step between step (iii) and step (iv), wherein during said heating step the web temperature is maintained above the glass transition temperature of the phenolic resin during a period of between 0.1 and 60 seconds.

34. The method according to claim 1 further comprising a heating step between step (iii) and step (iv), wherein during said heating step the web temperature is maintained above the glass transition temperature of the phenolic resin during a period of between 0.1 and 60 seconds.

* * * * *

UNITED STATES PATENT AND TRADEMARK OFFICE

CERTIFICATE OF CORRECTION

PATENT NO. : 7,195,859 B2
APPLICATION NO. : 10/530130
DATED : March 27, 2007
INVENTOR(S) : Eric Verschueren It is certified that error appears in the above-identified patent and that said Letters Patent is hereby corrected as shown below:

In Claim 2, Column 15, line 3, “meted” should be --method--.

In Claim 5, Column 15, line 16, “dining” should be --during--.

In Claim 13, Column 15, line 62, “dining” should be --during--.

Signed and Sealed this

Twenty-second Day of September, 2009

David J. Kappos

David J. Kappos
*Director of the United States Patent and Trademark Office*